United States Patent
Bickel

(10) Patent No.: US 9,176,171 B2
(45) Date of Patent: Nov. 3, 2015

(54) DATA ALIGNMENT IN LARGE SCALE ELECTRICAL SYSTEM APPLICATIONS

(75) Inventor: Jon A. Bickel, Murfreesboro, TN (US)

(73) Assignee: SCHNEIDER ELECTRIC USA, INC., Palatine, IL (US)

( * ) Notice: Subject to any disclaimer, the term of this patent is extended or adjusted under 35 U.S.C. 154(b) by 411 days.

(21) Appl. No.: 12/950,773

(22) Filed: Nov. 19, 2010

(65) Prior Publication Data

US 2012/0130656 A1    May 24, 2012

(51) Int. Cl.
| | | |
|---|---|---|
| G01R 21/133 | (2006.01) | |
| H02J 13/00 | (2006.01) | |

(52) U.S. Cl.
CPC ........... *G01R 21/133* (2013.01); *H02J 13/0006* (2013.01)

(58) Field of Classification Search
USPC ................................ 702/57, 60, 64–66, 72, 75
See application file for complete search history.

(56) References Cited

U.S. PATENT DOCUMENTS

| | | | |
|---|---|---|---|
| 3,654,479 A | | 4/1972 | Catherin |
| 4,817,014 A | | 3/1989 | Schneider et al. |
| 4,855,671 A | | 8/1989 | Fernandes |
| 5,243,547 A | * | 9/1993 | Tsai et al. ........................ 703/14 |
| 5,353,404 A | | 10/1994 | Abe et al. |
| 6,088,659 A | | 7/2000 | Kelley et al. |
| 6,094,650 A | | 7/2000 | Stoffel et al. |
| 6,266,452 B1 | | 7/2001 | McGuire |
| 6,292,683 B1 | | 9/2001 | Gupta et al. |
| 6,321,169 B1 | * | 11/2001 | Iwao ................................ 702/65 |
| 7,684,441 B2 | | 3/2010 | Bickel et al. |
| 2003/0014678 A1 | | 1/2003 | Ozcetin et al. |
| 2003/0033094 A1 | | 2/2003 | Huang |
| 2003/0222509 A1 | | 12/2003 | Andarawis et al. |
| 2004/0225649 A1 | | 11/2004 | Yeo et al. |
| 2005/0050095 A1 | | 3/2005 | Hurtis et al. |
| 2007/0005277 A1 | | 1/2007 | Bickel et al. ..................... 702/61 |

(Continued)

FOREIGN PATENT DOCUMENTS

| | | |
|---|---|---|
| GB | 2220753 A | 1/1990 |
| WO | 00/65480 A2 | 11/2000 |
| WO | 2005/059572 A1 | 6/2005 |

OTHER PUBLICATIONS

PCT Written Opinion corresponding to International Application No. PCT/US2006/025444, European Patent Office, dated Oct. 10, 2006 (9 pages).

(Continued)

*Primary Examiner* — Mischita Henson
(74) *Attorney, Agent, or Firm* — Lando & Anastasi LLP

(57) ABSTRACT

A method for automatically aligning measured power-related data in a power monitoring system to a common reference point. A conductor in a power delivery system is modeled according to an equivalent pi model of a transmission line that is characterized by model parameters. The conductor is monitored on both ends by a reference monitoring device and a second monitoring device. The voltage and current are measured in either the reference monitoring device or the second monitoring device and a phase shift offset between the voltages or currents at the two devices is calculated. The calculated phase shift offset corresponds to a temporal delay between events observed at the pair of devices, and calculating and storing the phase shift offset allows a power monitoring system controller to more accurately align data received from monitoring devices.

25 Claims, 7 Drawing Sheets

(56) References Cited

U.S. PATENT DOCUMENTS

2010/0111112 A1   5/2010   Bickel .......................... 370/503
2012/0130656 A1   5/2012   Bickel

OTHER PUBLICATIONS

International Search Report corresponding to International Application No. PCT/US2006/025444, European Patent Office, dated Oct. 10, 2006 (6 pages).

PCT Written Opinion corresponding to International Patent Application No. PCT/US2006/025445, European Patent Office, dated Nov. 24, 2006, (7 pages).

International Search Report corresponding to International Application No. PCT/US2006/025445, European Patent Office, dated Nov. 24, 2006, (3 pages).

Article: "Cross Correlation—Auto Correlation—2D Pattern Identification," by Paul Bourke, dated Aug. 1996, 11 pages.

Article: "The Need for Speed," by Richard P. Bingham, Dranetz-BMI, dated Nov. 1999, 12 pages.

Article: "GPS World—Pacify the Power GPS Harness for Large-Area Electrical Grid," by Dennis Erickson and Carson Taylor, dated Apr. 1, 2005, 9 pages.

Article: "Protection, Control, Reliability and Diagnostic Improvements Via Single-Processor Control of Circuit Breakers in Low Voltage Switchgear," IEEE, copyright 2005, 10 pages.

Article: "Innovation to Reality—Introducing State-Of-The-Art Protection and Monitoring to Existing Low-Voltage Switchgear," IEEE, copyright 2005, 11 pages.

Article: "Entellisys™ Low-Voltage Switchgear," GE Consumer & Industrial Electrical Distribution; dated 2005; 17 pages.

Ren C. Luo et al., "Automated Decision Tree Generation for Object Recognition and Classification" Proceedings of The International Conference on Industrial Electronics, Control and Instrumentation (IECON). Industrial Applications of Mini, Micro and Personal Computers, Document No. XP-0020568809, dated Sep. 29, 1986 pp. 357-362.

Anand et al. "Using Clock Accuracy to Guide Model Synthesis in Distributed Systems: An Application in Power Grid Control." IEEE Symposium on Precision Clock Synchronization for Measurement Control and Communication (ISPCS). Piscataway, New Jersey, USA, Sep. 27, 2010 (pp. 7-12).

Izykowski et al. "Accurate Location of Faults on Power Transmission Lines with Use of Two-End Unsynchronized Measurements." IEEE Transactions on Power Delivery. vol. 21, No. 2, Apr. 2006 (pp. 627-633).

Novosel et al. "Unsynchronized Two-Terminal Fault Location Estimation." IEEE Transactions on Power Delivery. vol. 11, No. 1, Jan. 1996 (pp. 130-138).

International Search Report mailed Dec. 12, 2012 which issued in corresponding International Patent Application No. PCT/US2011/057071 (5 pages).

Written Opinion mailed Dec. 12, 2012 which issued in corresponding International Patent Application No. PCT/US2011/057071 (9 pages).

* cited by examiner

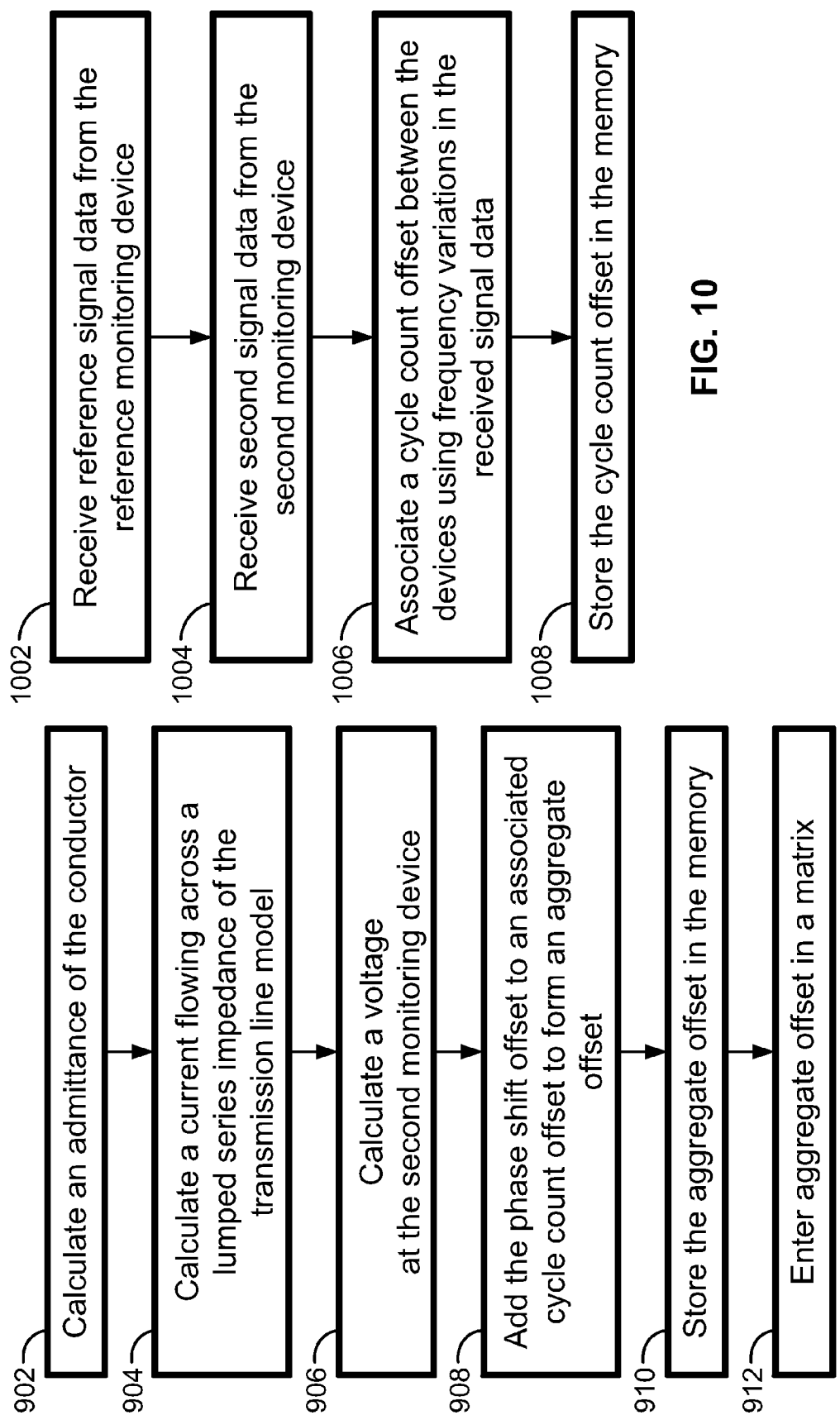

DATA ALIGNMENT IN LARGE SCALE ELECTRICAL SYSTEM APPLICATIONS

FIELD OF THE INVENTION

The present invention relates generally to utility monitoring systems, and, in particular, to automated precision alignment of data using variations in the fundamental frequency and phase shift offsets between monitoring devices.

BACKGROUND

U.S. Pat. No. 7,684,441 generally discloses techniques for aligning measured data by analyzing the grid's frequency or amplitude variations to generate a cycle count offset by which one monitoring device's data lags or leads a reference monitoring device's data. This approach works very well for radial-fed power systems. However, power systems that include apparatuses such as transformers or very long conductor lengths such as transmission lines can introduce phase shifts into the measured data between monitoring devices upstream and downstream of the transformers or generators. These small phase shifts introduce fractional offsets in the cycle counts that can cause the cycle count offset to be shifted by fractions of a full cycle, such as defined by a 50 Hz or 60 Hz power signal. What is needed is an improved method for aligning measured data synchronously by calculating the precise number of cycles by which the measured data between a pair of monitoring devices differ for sequence of events analysis (e.g., how and when a fault propagates through the electrical system), fault detection analysis, clock adjustment in the monitoring devices, determining power flows throughout an electrical system, and other analyses.

BRIEF SUMMARY

The present disclosure improves on the data alignment approaches disclosed in U.S. Pat. No. 7,684,441. Aspects of the present disclosure propose a transmission line model that characterizes a circuit between the reference monitoring device and another monitoring device, and uses the transmission line models to calculate a phase shift offset between two sets of measured data (such as current or voltage). Aspects of the present disclosure are particularly well suited for very large electrical systems, such as those spanning across a large geographic area or multiple jurisdictions, such as multiple municipalities, utilities, or states, or for electrical systems that include apparatuses that can introduce phase shifts into the fundamental power signal. Aspects of the present disclosure are also suited for implementations by demand-side energy consumers that have systems which introduce phase shift offsets, due to, for example, electrical apparatuses. Because of the magnitude and complexity of such electrical systems, accurate data alignment from frequency modulation alignment algorithms may be problematic due to the inherent phase shift of the voltage signal. Incorporating utility system models and knowledge of metering locations with frequency modulation alignment algorithms provides a method for ascertaining phase shifts across large electrical systems. Error checking algorithms both reduce the number of cycle count offset errors and validate phase shift solutions from multiple vantages.

According to an aspect of the present disclosure, a method is disclosed for automatically aligning measured power-related data in a power monitoring system to a common reference point. The method includes: receiving from a reference monitoring device in the power monitoring system a voltage and a current measured by the reference monitoring device over a communications network. The method further includes: retrieving model parameters of a transmission line model that characterizes a circuit including a conductor connected between the reference monitoring device and a second monitoring device in the power monitoring system. The model parameters can be retrieved from a memory. The method further includes calculating a phase shift offset according to a function that includes the measured voltage, the measured current, and the model parameters. The phase shift offset can indicate a phase difference of the current or voltage between the reference monitoring device and the second monitoring device. The method further includes storing the phase shift offset associated with the reference monitoring device and the second monitoring device. The phase shift offset can be stored in the memory. The model parameters that characterize the transmission line circuit can include a series resistance, a series inductance, a shunt admittance, or a subset of these. The shunt admittance can further include a shunt conductance and a shunt capacitance. Aspects of the present disclosure provide that a computer readable medium can be encoded with instructions for directing a controller to perform the disclosed method.

According to another aspect of the present disclosure, the method further includes calculating the series resistance, the series inductance, or the shunt admittance using modeling data associated with the transmission line model. The modeling data can include a frequency of the voltage or the current measured by the reference monitoring device, a length of the conductor between the reference monitoring device and the second monitoring device, a spacing distance between the conductor and an other conductor carrying current between the reference monitoring device and the second monitoring device, a cross-sectional area of the conductor, or a material of the conductor. The method can further include storing the calculated series resistance, the series inductance, or the shunt admittance in the memory. According to another aspect of the present disclosure, the method can include receiving an input indicative of the series resistance, the series inductance, or the shunt admittance and storing the inputted series resistance, the series inductance, or the shunt admittance in the memory.

The voltage measured by the reference monitoring device can be a potential between the conductor and an other conductor carrying current between the reference monitoring device and the second monitoring device. The potential can be measured at the reference monitoring device. The other conductor can be a neutral conductor and the conductor can be a line conductor. The conductor and the other conductor can both be line conductors and the conductor can carry a first phase of the current, and the other conductor can carry a second phase of the current.

According to yet another aspect of the present disclosure, the calculation of the phase shift offset can include: calculating the shunt admittance, calculating a current flowing across a lumped series impedance of the transmission line model, and calculating a voltage at the second monitoring device. The lumped series impedance of the transmission line model can be calculated as a function of the measured current, the measured voltage, and the calculated admittance. The lumped series impedance can represent both the series resistance and a reactance of the series inductance of the transmission line model. The voltage at the second monitoring device can be calculated according to a function of the measured voltage and the current flowing across the lumped series impedance.

According to yet another aspect of the present disclosure, the method can further include adding the phase shift offset to a determined cycle count offset associated with the reference monitoring device and the second monitoring device. The cycle count offset can represent an integer number of cycles that a measured characteristic by the reference monitoring device is to be added to or subtracted from a cycle count of the measured characteristic by the second monitoring device at a measured time. The cycle count can represent a number of consecutive cycles of the measured voltage or current counted by the reference monitoring device or the second monitoring device. The cycles can represent a period between consecutive positive zero-crossings of the measured voltage or current or between consecutive negative zero-crossings of the measured voltage or current. Alternatively, the cycles can represent a period between consecutive positive and negative zero-crossings of the measured voltage or current. The power monitoring system can include an apparatus that introduces a phase shift in the current or voltage measured by electrical circuits downstream of the apparatus relative to electrical circuits upstream of the apparatus.

Responsive to storing the phase shift offset, the measured current or the measured voltage of the reference monitoring device can be synchronized to the same common reference point with the current or voltage measured by the second monitoring device.

According to still another aspect of the present disclosure, the method can further comprise: receiving reference signal data from the reference monitoring device. The reference signal data can represent frequency variations in the measured current or voltage at each cycle of a predetermined number of cycle counts of the measured current or voltage by the reference monitoring device. The method can further comprise: associating a reference one of the cycle counts of the measured current or voltage by the reference monitoring device with a corresponding one of the cycle counts of the measured current or voltage by the second monitoring device using the frequency variations in the measured current or voltage by the reference monitoring device and the frequency variations in the measured current or voltage by the second monitoring device to produce a cycle count offset between the reference cycle count and the corresponding cycle count, and storing the cycle count offset. Aspects of the present disclosure further comprise adding the phase shift offset to the cycle count offset to produce an aggregate offset. The aggregate offset can be an indication of how many cycles the measured current or voltage by the reference monitoring device lags or leads the measured current or voltage by the second monitoring device, and can be stored in the memory. Aspects of the present disclosure still further provide that the receiving, the retrieving, the calculating, and the storing can be carried out using a controller remote from the reference monitoring device and the second monitoring device.

According to still another aspect of the present disclosure, the method can further include instructing the reference monitoring device or the second monitoring device to adjust a time reference of the reference monitoring device or the second monitoring device based on at least the phase shift offset to cause the voltage or current measured by the reference monitoring device and the second monitoring device to be synchronized to the common reference point. Aspects of the present disclosure provide that for a power monitoring system with a plurality of monitoring devices including the reference and second monitoring devices, the method can further include calculating a phase shift associated with each of the monitoring devices relative to every other of the monitoring devices. The corresponding phase shift offset can be stored in a phase shift offset matrix having a number of rows corresponding to the number of monitoring devices in the power monitoring system and a number of columns corresponding to the number of monitoring devices in the power monitoring system.

According to another aspect of the present disclosure, the method can further include: measuring a real and reactive power flow between the reference monitoring device and the second monitoring device; and storing the calculated phase shift offset and an indication of the real and reactive power flow in a matrix for calculating a phase shift offset for a given real and reactive load.

Aspects of the present disclosure provide a power monitoring system for aligning data. The power monitoring system includes: a system controller coupled to a memory; a reference monitoring device, and a second monitoring device. The reference monitoring device can have a communication interface, a controller, and a sensing circuit, with the communication interface coupled to the system controller. The second monitoring device can have a communication interface coupled to the system controller, a controller, and a sensing circuit, with the communication interface coupled to the system controller. The system controller can be remote from the reference monitoring device and the second monitoring device. The system controller can be configured to receive from the reference monitoring device a voltage and a current measured by the reference monitoring device. The system controller can be further configured to retrieve from the memory model parameters of a transmission line model that characterizes a circuit including a conductor connected between the reference monitoring device and the second monitoring device. The system controller can be further configured to calculate a phase shift offset according to a function that includes the measured voltage, the measured current, and the model parameters. The phase shift offset can indicate a phase difference of the current or voltage between the reference monitoring device and the second monitoring device. The system controller can be further configured to store the phase shift offset associated with the reference monitoring device and the second monitoring device. The reference monitoring device and the second monitoring device can be power meters. The model parameters can include a series resistance and a series inductance. The model parameters can further include a shunt admittance.

According to still another aspect of the present disclosure, the power monitoring system can be further configured to calculate the phase shift offset by: calculating a shunt admittance; calculating a current flowing across a lumped series impedance of the transmission line model; and calculating a voltage at the second monitoring device. The lumped series impedance can be calculated as a function of the measured current, the measured voltage, and the calculated admittance. The lumped series impedance can represent the sum of the series resistance and a reactance of the series inductance. The voltage at the second monitoring device can be a function of the measured voltage and the current flowing across the lumped series impedance.

According to another aspect of the present disclosure, the power monitoring system can be further configured to add the phase shift offset to a determined cycle count offset associated with the reference monitoring device and the second monitoring device. The cycle count offset can represent an integer number of cycles that a measured characteristic by the reference monitoring device is to be added to or subtracted from a cycle count of the measured characteristic by the second monitoring device at a measured time. The cycle count can represent a number of consecutive cycles of the measured voltage or current counted by the reference monitoring device or the second monitoring device.

According to still another aspect of the present disclosure, the system controller is further configured to: receive reference signal data from the reference monitoring device, receive second signal data from the second monitoring device, associate a reference one of the cycle counts of the measured current or voltage by the reference monitoring device with a corresponding one of the cycle counts of the measured current or voltage by the second monitoring device using the frequency variations in the measured current or voltage by the reference monitoring device and the frequency variations in the measured current or voltage by the second monitoring device to produce a cycle count offset between the reference cycle count and the corresponding cycle count; and store the cycle count offset in the memory. The reference signal data can represent frequency variations in the measured current or voltage at each cycle of a predetermined number of cycle counts of the measured current or voltage by the reference monitoring device. The second signal data can represent frequency variations in the measured current or voltage at each cycle of a predetermined number of cycle counts of the measured current or voltage by the second monitoring devices.

The present disclosure expressly contemplates combining any one or more of the disclosed systems, aspects, or methods in any permutation.

The foregoing and additional aspects of the present disclosure will be apparent to those of ordinary skill in the art in view of the detailed description of various configurations and/or aspects, which is made with reference to the drawings, a brief description of which is provided next.

BRIEF DESCRIPTION OF THE DRAWINGS

The foregoing and other advantages of the present disclosure will become apparent upon reading the following detailed description and upon reference to the drawings.

FIG. 9 is a flowchart illustrating a method of calculating the phase shift offset between two monitoring devices and adding the phase shift offset to an associated cycle count offset for the monitoring devices.

FIG. 10 is a flowchart illustrating a method of associating a cycle count offset between two monitoring devices.

Figure 1:
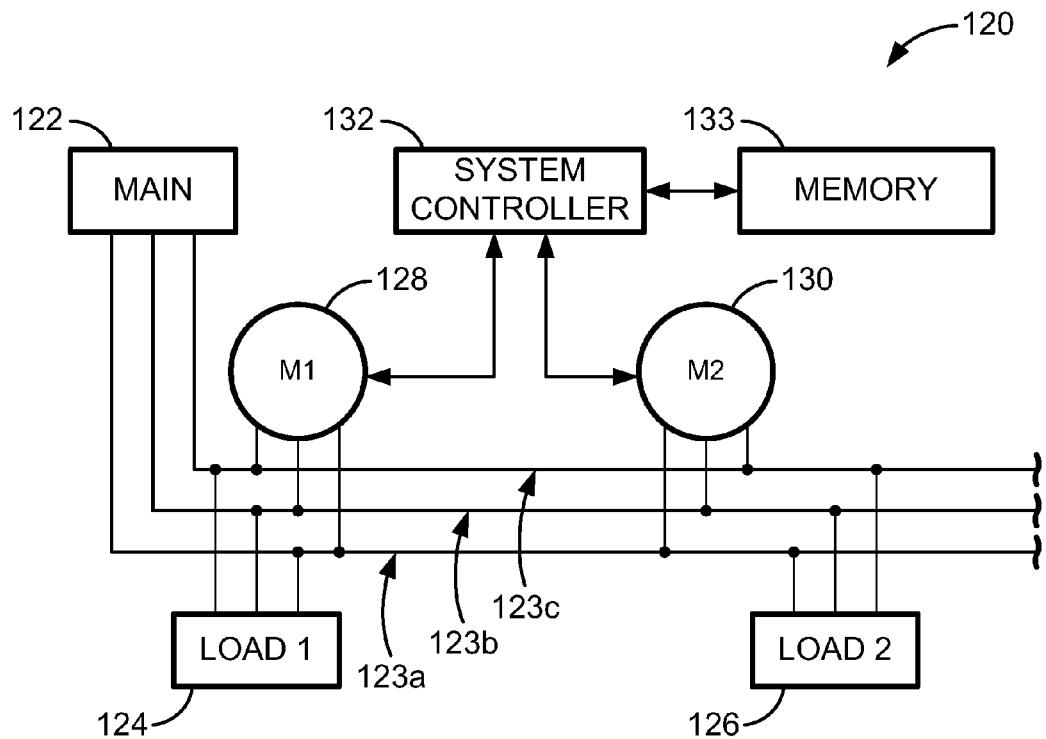
FIG. 1 illustrates a simplified configuration of a power monitoring system.

While the present disclosure is susceptible to various modifications and alternative forms, specific embodiments or aspects have been shown by way of example in the drawings and will be described in detail herein. It should be understood, however, that the present disclosure is not intended to be limited to the particular forms disclosed. Rather, the present disclosure is to cover all modifications, equivalents, and alternatives falling within the spirit and scope of the invention as defined by the appended claims.

DETAILED DESCRIPTION

FIG. 1 illustrates a simplified configuration of a power monitoring system 120. The power monitoring system 120 includes a main 122 connected to a first load 124 and to a second load 126. A reference monitoring device 128 and a second monitoring device 130 measure electrical characteristics or parameters associated with the power delivered to the first load 124 and the second load 126, respectively. Each monitoring device (128, 130) is communicatively coupled to a system controller 132. In a configuration, the system controller 132 can be a computer. The reference monitoring device 128 is alternately referred to herein as a first monitoring device. The measured electrical characteristics can include current or voltage, for example.

The reference monitoring device 128 is connected to the second monitoring device 130 by a first conductor 123a, a second conductor 123b, and a third conductor 123c. The conductors (123a, 123b, 123c) can be line conductors used to carry three different current phases of an alternating current power deliver system arranged in a wye configuration. Alternately, configurations of the present disclosure can include more than three or less than three conductors connecting the reference monitoring device 128 and the second monitoring device 130, and the conductors can be either line conductors used to carry current between the monitoring devices (128, 130) or can be neutral conductors. The conductors (123a, 123b, 123c) can be arranged in a geometric configuration with the conductors generally parallel to one another and can be suspended from a supporting assembly (such as on an H-frame), can be buried under ground, or can be arranged in another configuration that can include a combination of suspending and burying the conductors (123a, 123b, 123c). The conductors (123a, 123b, 123c) can be made of aluminum, brass, bronze, copper, iron, silver, sodium, steel, or any other suitable conductive material for carrying current in an alternating current power delivery system. Furthermore, the conductors (123a. 123b. 123c) can be a stranded conductor or a solid conductor. Each conductor (123a, 123b, 123c) has a cross-sectional area, a characteristic radius describing the cross-sectional area, and a length between the reference monitoring device 128 and the second monitoring device 130.

Referring to a configuration with a first conductor 123a and a neutral conductor, the first conductor 123a and the neutral conductor form a transmission circuit of AC voltage and current from the reference monitoring device 128 to the second monitoring device 130. As will be discussed below in connection with FIGS. 5 and 6, a transmission circuit can be modeled by a transmission line model described by a set of model parameters including a series resistance, a series impedance, a shunt admittance, or a subset of these. The model parameters are influenced by design criterion of the transmission circuit remedies, the choice of conductive material, the geometric configuration of the conductors, the cross-sectional area of the conductors, and the length of the conductors.

Figure 2:
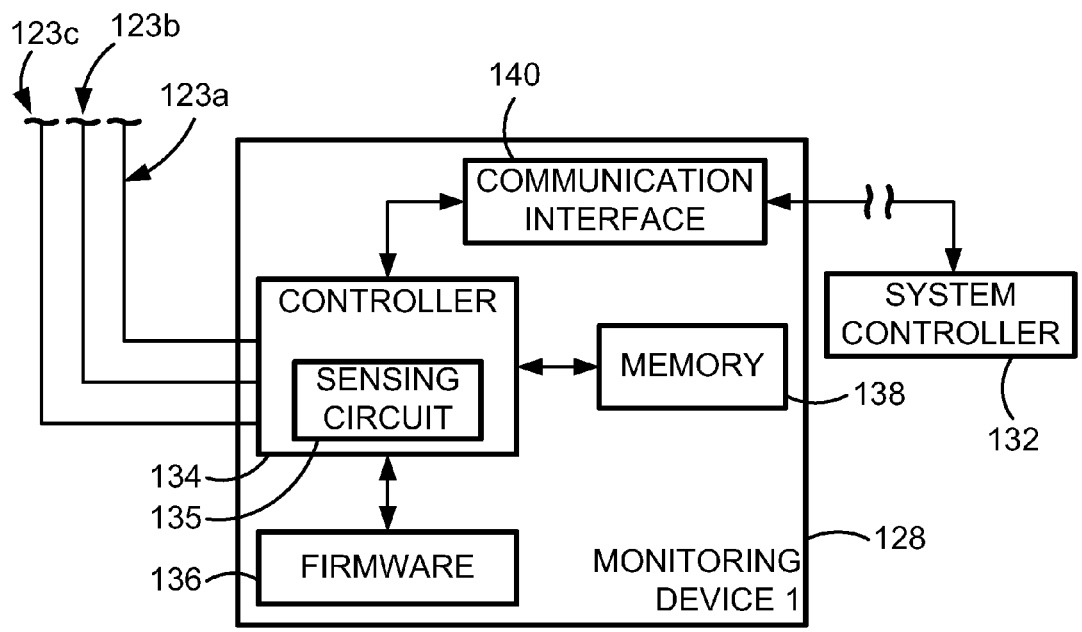
FIG. 2 is a block diagram of a monitoring device.

The reference monitoring device 128 can be a power meter (or electric meter), such as shown in FIG. 2. The reference monitoring device 128 includes a controller 134, firmware 136, a memory 138, and a communication interface 140. The communication interface 140 provides a communicative coupling between the system controller 132 and the controller 134 of the reference monitoring device 128. The controller 134 is connected to the conductors (123a, 123b, 123c) and includes a sensing circuit 135 for measuring electrical characteristics of the voltage or current carried by at least one of the conductors (123a, 123b, 123c). For example, the sensing circuit 135 can measure the instantaneous or average voltage or current between any two line conductors carrying different phases of current, or between a line conductor and a neutral conductor. The firmware 136 includes machine instructions for directing the controller 134 to carry out operations required for the reference monitoring device 128. Memory 138 is used by the controller 134 to store electrical data measured by the sensing circuit 135. The second monitoring device 130 is similar to the reference monitoring device 128 shown in FIG. 2 and includes similar components and is configured to provide similar functionality.

All real-world electrical signals in power systems experience subtle variations in their frequency and amplitude over time. These variations of the signal's frequency and amplitude are both indeterminate and unique with respect to time. Each monitoring device located on the same utility grid will simultaneously experience the same frequency variations. Analysis of the frequency and variations of the signal can then be used to precisely align the data of one monitoring device with respect to another monitoring device, or all the monitoring devices with each other. The details of a technique for aligning the data of one monitoring device with respect to another are discussed below.

The data alignment techniques of the present disclosure allow all monitoring devices in a power utility system to be aligned to the zero-crossing (or to any other point of reference along a cycle) of three phase voltages. The present invention also anticipates potential phase shifts between various monitoring devices, for example, those caused by certain transformer configuration, or due to transmission line series resistance, series inductance, or shunt admittance. Once the data of the monitoring devices are aligned with each other, the system data is essentially aligned very precisely with respect to the time it occurred, making more complex data analyses feasible.

In operation of the power monitoring system 120, instructions from the system controller 132 are received by the monitoring device 128 via the communication interface 140. Those instructions can include instructions that direct the controller 134 to mark the cycle count, to begin storing electrical parameter data, or to transmit to the monitoring system software 132 electrical parameter data stored in the memory 138. The electrical parameter data can include any data acquired by monitoring devices, including any combination of frequency variations, amplitude variations, and phase variations.

The present disclosure provides an algorithm that precisely, automatically, and temporally aligns the data from multiple monitoring devices to the same voltage zero-crossing. Other data alignment aspects discussed below are based on this capability. The data alignment is facilitated by functionality in both the monitoring devices 128, 130 and the monitoring system software running on the system controller 132. The requirements of each will be discussed individually, with requirements of the monitoring devices (128, 130) described in connection with the reference monitoring device 128 for brevity and clarity. Collection and partial analysis of data is performed in the reference monitoring device 128.

From the time the monitoring device 128 is energized, a cycle count is performed of the measured voltage signals. The cycle count is sequentially iterated with each positive voltage zero-crossing (or, alternatively, with each negative voltage zero-crossing). Therefore, the cycle count represents a number of consecutive cycles. Alternatively, a half-cycle count can be sequentially iterated with each consecutive zero-crossing, including consecutive positive and negative zero-crossings. As the reference monitoring device 128 measures both the frequency and amplitude variations of the voltage and current from cycle to cycle, a comparison is performed to their respective nominal values. The frequency and amplitude variations and associated cycle count are tracked by the device firmware 136. The associated monitoring device time at any specified cycle count can be stored in the memory 138.

The monitoring system software executed by the system controller 132 initiates alignment of the data associated with the multiple monitoring devices (128, 130) by sending a global command to all monitoring devices (128, 130) on the power monitoring system 120 to mark their cycle count, time and buffer a predetermined amount of cycle-by-cycle data.

This predetermined amount of data is established based on the number of monitoring devices in the power monitoring system 120, the communications time delays in the power monitoring system 120 and the magnitude of frequency and amplitude variations. When the buffering is complete, the monitoring devices (128, 130) transmit their buffered data to the system controller 132.

Once the data is collected by the monitoring devices (128, 130), the monitoring system software uploads the buffered data for analysis via a communication network. The couplings between the monitoring devices (128, 130) and the system controller 132 can be considered a communication network. There is generally a time offset in each monitoring device's buffered data because the monitoring devices (128, 130) do not generally begin buffering the data simultaneously due to communication time delays in the power monitoring system 120 and internal time delays within the monitoring devices. The buffered data is analyzed by the monitoring system software on the system controller 132 to locate the highest correlation in frequency between all the monitoring devices (128, 130). Generally, the highest correlation is located by sliding the buffered frequency data per cycle at a time in one monitoring device with respect to another until the frequency variations line up with each other as shown in FIG. 3.

Figure 3:
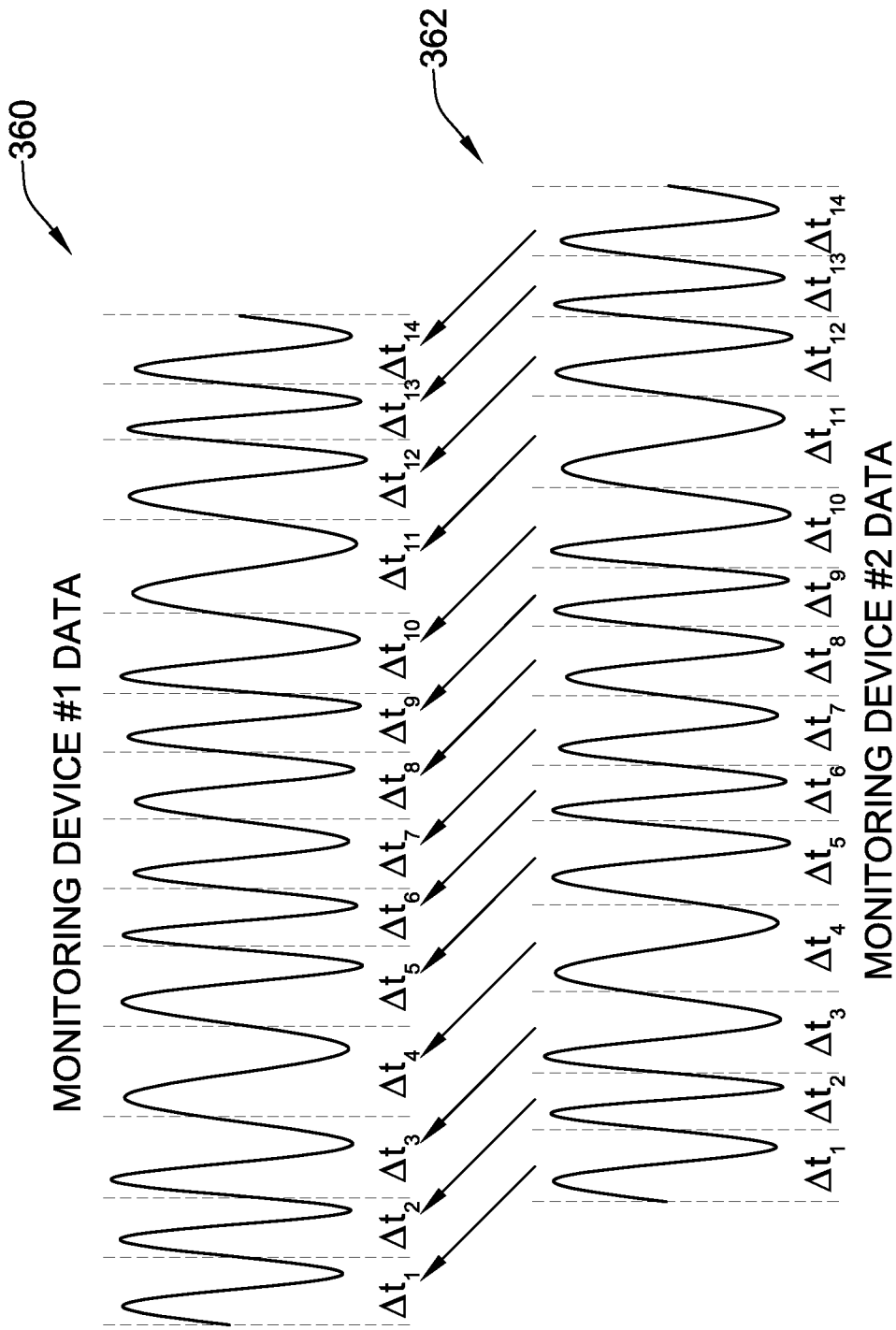
FIG. 3 illustrates sample measured waveform data from the reference monitoring device and the second monitoring device.

FIG. 3 illustrates sample measured waveform data from the reference monitoring device 128 and the second monitoring device 130. The measured waveform data can be a voltage or a current between two line conductors or between a line conductor and a neutral conductor. The waveform data exhibits frequency modulation and amplitude modulation of a signal with a fundamental frequency. The reference monitoring device 128 can use the waveform data to measure the frequency or the amplitude of the waveform data from cycle-to-cycle. That is, the reference monitoring device 128 can use the waveform data to associate a frequency or an amplitude of the waveform data with each measured zero-crossing (or equivalently, with the cycle count corresponding to each measured zero-crossing) or any other reference point along the cycle (zero-crossing just happens to be particularly convenient, but any other reference point can be used without departing from the scope of the present disclosure). Furthermore, the reference monitoring device 128 can optionally compare the respective measured cycle-to-cycle frequencies and amplitudes to their respective nominal values. The reference monitoring device can thereby associate a variation from the nominal frequency value (such as the fundamental frequency of a power delivery system) or from the nominal amplitude value for each cycle. The frequencies, or the variations in frequencies, measured in the reference monitoring device 128 can then be associated with their corresponding cycle counts to form reference signal data 360. Similarly, frequencies, or variations in frequencies, measured in the second monitoring device 130 can be associated with their corresponding cycle counts to form second signal data 362.

The frequency data 360 for the monitoring device 128 is "slid" relative to the frequency data 362 for the monitoring device 130 until the frequency data for each device line up. Thus, the zero-crossing associated with $\Delta t_1$ of monitoring device 128 is aligned with the zero-crossing associated with $\Delta t_1$ of monitoring device 130, the zero-crossing associated with $\Delta t_2$ of monitoring device 128 is aligned with the zero-crossing associated with $\Delta t_2$ of monitoring device 130, and so on. Cross-correlation algorithms for "sliding" two data sets relative to one another until they are aligned are discussed in further detail below in connection with FIG. 4. The term "slide" is used colloquially in this context. Skilled artisans will appreciate the precise technical functioning of cross-correlation algorithms.

Once the buffered data is aligned, the cycle count of the first monitoring device 128 is associated with the cycle count of the second monitoring device 130 in the software on the system controller 132. An on-board monitoring device time can optionally also be aligned or associated relative to one another. This process is repeated for each monitoring device in the power monitoring system 120 until all devices' cycle counts are associated with each other based on measured frequency variations. During the data alignment process, the monitoring system software on the system controller 132 builds a matrix of each device's cycle count and time with respect to each other and the time on the system controller 132.

Although FIG. 2 shows a simplified power monitoring system 120 with just two monitoring devices (128, 130), the data alignment algorithm of the present disclosure can be applied to any power monitoring system, including a power monitoring system having more than two monitoring devices and more than one power generator. For ease of illustration and discussion, only two monitoring devices (128, 130) have been discussed.

Once the data of the two monitoring devices (128, 130) is aligned relative to one another, there is typically no need to realign the data again unless a monitoring device loses its voltage signal or resets itself. In those cases, only the monitoring devices that lose their voltage signal or reset need to be realigned in accordance with the present invention. The data alignment technique of the present disclosure can be initiated by an event, such as an undervoltage or overvoltage condition, connecting or disconnecting a load to the power monitoring system, a change in the characteristics of the voltage, current, or a load, a monitoring device reset, or a power loss. The data alignment technique can also be initiated automatically by the monitoring software or manually by a user.

Figure 4:
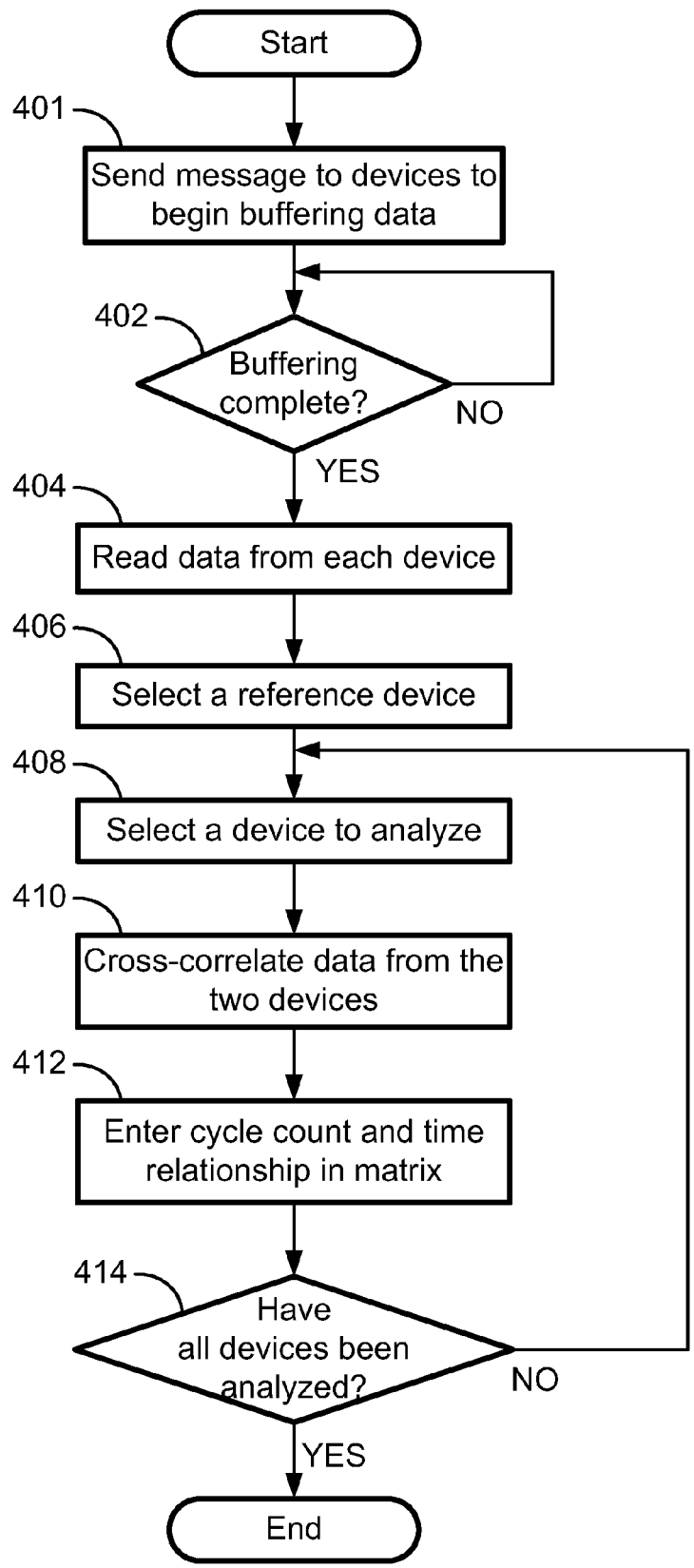
FIG. 4 is a flowchart that can be implemented as a data alignment algorithm executed by the system controller.

FIG. 4 is a flowchart that can be implemented as a data alignment algorithm executed by the system controller 132. The data alignment algorithm begins by sending a message to the monitoring devices (such as monitoring devices 128, 130) to begin buffering data (401) until buffering is complete (402). The system controller 132 reads the data from each device (404). The data represents, in an implementation, electrical parameter data such as variations in (fundamental) frequency, variations in amplitude, or variations in phase, and associated cycle counts of the variations. The data can be generally referred to as signal data. Preferably, the signal data represents variations in fundamental frequency for each measured cycle count. Fundamental frequency is a preferred criterion because it remains unchanged throughout the power monitoring system, even if transformers are present in the system. Amplitude and phases can shift when transformers are present in the system; however, the present disclosure contemplates using amplitude and phase information as criteria.

The system controller 132 selects a reference monitoring device (406), such as reference monitoring device 128, and then selects a monitoring device to analyze (408), such as second monitoring device 130. The signal data from the monitoring devices (128, 130) is then cross-correlated (410), and each device's cycle count and time relationships are entered into a matrix (412). The cross-correlation is carried out by a conventional cross-correlation algorithm, preferably such as the one provided below in Equation 1.

$$r(d) = \frac{\sum_i [(x(i) - mx) * (y(i-d) - my)]}{\sqrt{\sum_i (x(i) - mx)^2} \sqrt{\sum_i (y(i-d) - my)^2}} \quad \text{(Equation 1)}$$

The correlation coefficient is represented by r(d), the delay (offset or shift) being represented by d, where $-1 \leq r(d) \leq 1$ for two series x(i) and y(i) representing the respective signal data from the monitoring devices (128, 130); and mx and my are the means of the corresponding series x(i) and y(i). According to an implementation, the correlation algorithm is a circular correlation algorithm in which out-of-range indexes are "wrapped" back within range. In another implementation, the correlation algorithm is a linear correlation algorithm in which each series is repeated. In still other implementations, the correlation algorithm is a pattern-matching algorithm or a text-search algorithm. Using a conventional cross-correlation algorithm such as Equation 1 above, the system controller 132 calculates a correlation coefficient r(d) between at least a portion of the reference signal data (such as about 400 cycles) from the reference monitoring device 128 and the second signal data from the second monitoring device 130. The calculated correlation coefficient is stored, and the data of the second monitoring device is shifted relative to the reference device by one cycle.

As mentioned above, the out-of-range indexes can be wrapped back within range according to a circular correlation algorithm or the indexes can be repeated according to a linear correlation algorithm. A correlation coefficient is calculated using the shifted data and if no further shifts are required, the second signal data of the second monitoring device 130 is aligned with the reference signal data of the reference monitoring device 128 at the point at which the maximum correlation coefficient is calculated or at which the correlation coefficient exceeds a threshold value, such as 0.5. It should be noted that when the correlation coefficient r(d) is close to 1.0, the algorithm can exit without conducting any further shifts.

After cross-correlation, the system controller 132 checks whether all monitoring devices have been analyzed (414), and if so, the algorithm ends. In an implementation, at the end of the flowchart shown in FIG. 4, a cycle count offset matrix, $M_{ij}$, is constructed in the system controller 132 and stored to the memory 133. The cycle count offset matrix is a matrix having a number of rows and a number of columns equal to a number, n, of monitoring devices in the power monitoring system 120. Each entry in the matrix, $M_{ij}$, is a difference between the reference cycle count, and the second cycle count, $M_j$, corresponding to the determined maximum of the cross-correlation algorithm between the reference monitoring device 128, which can be monitoring device number i, and the second monitoring device 130, which can also be monitoring device number j. That is, $M_{ij}=M_i-M_j$, with i and j each existing between 1 and n. The entries in the cycle count offset matrix $M_{ij}$ provide the number of cycle counts to offsets data from monitoring device number i relative to monitoring device number j.

The system controller 132 synchronizes the clocks of the second monitoring device and the reference device at the point of alignment. The system controller 132 reads the cycle count in each monitoring device and the associated monitoring device's on-board clock time. A monitoring device's on-board clock time and cycle count may drift with respect to each other due to the limitations of the on-board clock. Once the data is aligned, the cycle count is considered the absolute reference for a monitoring device. Due to the clock drift, it may be necessary to re-read the time associated with a device's cycle count periodically to reestablish the device's time. The software on the system controller 132 will then update the matrix containing the monitoring device time information.

Aspects of the present disclosure provide for incorporating electrical system modeling data into the data alignment algorithm for temporally aligning data synchronously from multiple monitoring devices. The temporal alignment of data from multiple monitoring devices can be influenced by phase shifts of signals between monitoring devices separated across long distances. Furthermore, aspects of the present disclosure provide for adjusting the temporal alignment of data from multiple monitoring devices with alignment increments smaller than an integer cycle count. Aspects of the present disclosure provide for aligning data from multiple monitoring devices according to the integer number and fractional number of cycles of offset between data received from a reference monitoring device and data received from a second monitoring device. Once the devices are aligned with each other, the system data is very precisely aligned with respect to the time it occurred making more complex data analysis more practicable.

Figure 5:
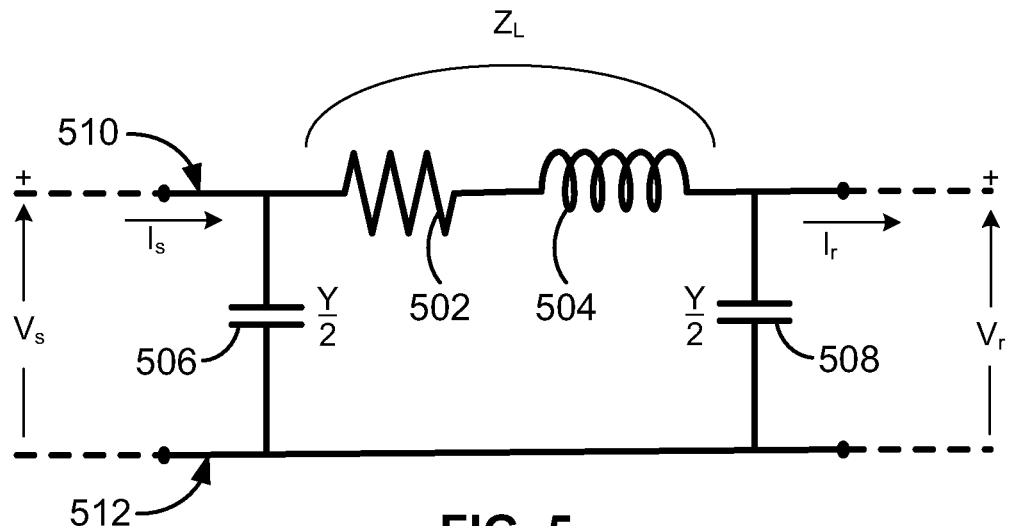
FIG. 5 is a basic transmission line model based on an equivalent pi model of a transmission line.

FIG. 5 is a basic transmission line model based on an equivalent pi model of a transmission line. The transmission line model in FIG. 5 includes two conductors (510, 512). The top conductor 510 can be a line conductor and the bottom conductor 512 can be a neutral conductor in a power delivery system. In the transmission line model, the left hand side of FIG. 5 is a sending side of the model, and the right hand side of FIG. 5 is a receiving side of the model. The voltage between the line conductor 510 and the neutral conductor 512 on the sending side is a sending voltage, $V_s$, and a sending current, $I_s$, is conducted through the line conductor on the sending side of FIG. 5. The voltage between the line conductor 510 and the neutral conductor 512 on the receiving side of FIG. 5 is a receiving voltage, $V_r$, and a receiving current, $I_r$, is conducted through the line conductor on the receiving side of FIG. 5.

In general, the performance of a power delivery transmission line is modeled with an equivalent pi model by accounting for the series resistance, series impedance, and shunt admittance. A transmission line's shunt admittance consists of two parameters: shunt conductance and shunt capacitive susceptance. The series resistance, series impedance, shunt admittance, or any subset of these can be a set of model parameters characterizing the performance of the equivalent pi model transmission line model. In the model shown in FIG. 5, the shunt conductance component of the shunt admittance is disregarded, and the series resistance is represented by the resistor 502, the series inductance is represented by the inductor 504, and the shunt admittance is represented by a first capacitor 506 and a second capacitor 508. The resistor 502 has a resistance equal to R. The inductor 504 has an inductance equal to L, and the first and second capacitors (506, 508) each have a shunt admittance equal to Y/2. To model the effect of distributed capacitance across the transmission line 510, the first capacitor 506 is modeled to be near the sending side of the transmission line 510 and the second capacitor 508 is modeled to be near the receiving side of the transmission line 510. In configurations where the transmission distance is small, the shunt admittance can optionally be disregarded and a satisfactory model of the transmission line can be based on the resistor 502 and the inductor 504.

The series resistance, series inductance, and shunt admittance can be calculated from the specific design and installation criteria of the transmission line and the transmission line configuration. In particular, the series resistance, which models the line resistance, is primarily a function of the length of the conductor, the cross-sectional area of the conductor, the resistivity of the conductive material, and whether the conductor is a stranded conductor or a solid conductor. The conductive material can be aluminum, brass, bronze, copper, iron, silver, sodium, steel, or any material suitable for conducting current in a power delivery system. The series inductance generally dominates the impedance of the line conductor. The series inductance and shunt admittance can generally be calculated based on the configuration of the transmission line. In particular, the series inductance and shunt admittance can be calculated from: the length of the conductor, the conductor type, conductor material, the geometric configuration of the conductors, whether the conductors are stranded or solid, the transposition of conductors, lines with multi-circuits, the frequency of the transmission signal, the voltage of the transmission signal, and the number of conductors per phase and so forth. The geometric configuration of the conductors can include a distance between two or more conductors oriented generally parallel to one another. In an implementation of the present disclosure, the above described design criteria of the transmission line can be input into a computer program configured to analyze the design criteria of the power delivery system and compute the equivalent series resistance, series inductance, and shunt admittance of the transmission line according to the equivalent pi model, or other relevant model, of the transmission line. Alternatively, the model parameters including the series resistance, series inductance, and shunt admittance can be directly input to the system controller 132 based on a direct or indirect measurement, a previous calculation, an estimation based on an empirical analysis, or another estimation of the circuit of the model parameters.

The resistor 502 and inductor 504 are connected in series on the line conductor, while the capacitors (506, 508) are connected between the line conductor and the neutral conductor on either end. The capacitors (506, 508) have a capacitive reactance, $X_C$, given by Equation 2 in terms of f, the fundamental frequency of the power delivery system, and C, which models the capacitance of the leakage (or charging) path for the AC line currents. The inductor 504 has an inductive reactance, $X_L$, given by Equation 3 in terms of f and L. The capacitors (506, 508) are also characterized by an admittance, Y, which is generally the inverse of a shunt impedance, but for the equivalent pi model configuration shown in FIG. 5, Y is the inverse of the capacitive reactance as in Equation 4. Because the admittance is divided between the two capacitors (506, 508) with equal admittance, each capacitor (506, 508) is associated with an equal admittance of Y/2.

$$X_C = 1/(2\pi fC) \quad \text{(Equation 2)}$$

$$X_L = 2\pi fL \quad \text{(Equation 3)}$$

$$Y = j/X_C \quad \text{(Equation 4)}$$

Figure 6:
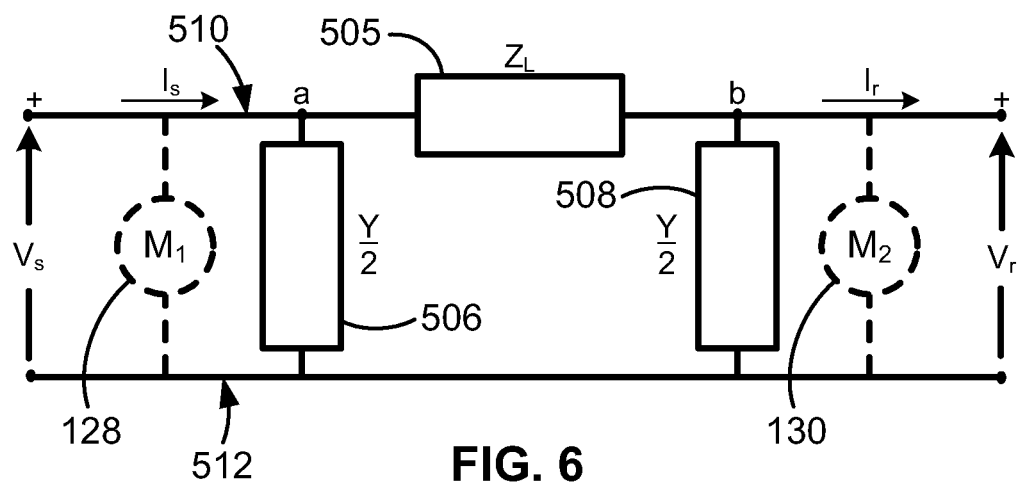
FIG. 6 is a transmission line model based on the equivalent pi model including a first meter and a second meter.

In Equation 4, j is the imaginary unit number, $\sqrt{-1}$. FIG. 6 is a transmission line model based on the equivalent pi model including a first meter 128 and a second meter 130. The model shown in FIG. 6 is similar to the model shown in FIG. 5 except that the series resistance and series inductance are combined to form a lumped series impedance 505, and the referencing monitoring device 128 monitors electrical parameters measured from the sent side and the second monitoring device 130 monitors electrical parameters measured from the received side. The lumped series impedance 505 has an impedance value of $Z_L$, given by Equation 5 in terms of R and $X_L$.

$$Z_L = R + jX_L \quad \text{(Equation 5)}$$

The model shown in FIG. 6 is used to estimate the phase shift offset of a signal conducted from the sent side to the received side. The phase shift offset is calculated according to the performance of the equivalent pi model based on the model parameters discussed above and on a measured voltage and current on either the measured side or the received side. The phase shift offset is calculated using Equation 6, which is a standard equation providing the sending voltage, $V_s$ in terms of the receiving voltage, $V_r$; the receiving current, $I_r$; the lumped impedance, $Z_L$; and the admittance, Y, for the equivalent pi model transmission line model circuit shown in FIG. 6. Equation 7 provides the sending current, $I_s$, in terms of $V_r$, $I_r$, $Z_L$, and Y for the same transmission line model circuit.

$$V_s = (1 + (Z_L Y)/2) V_r + Z_L I_r \quad \text{(Equation 6)}$$

$$I_s = Y(1 + (Z_L Y)/4) V_r + (1 + (Z_L Y)/2) I_r \quad \text{(Equation 7)}$$

Equation 6 can be used to calculate the phase shift offset between $V_r$ and $V_s$ by computing $V_r$ and then computing the phase shift offset angle, AO, which is given by Equation 8. Equation 8 could also be used to calculate $\Delta\theta$ using $I_r$ and $I_s$. In Equation 8, the function Im[ ] returns the imaginary component of a complex number in the brackets, and the function Re[ ] returns the real component of a complex number in the brackets.

$$\Delta\theta = \arctan(Im[V_s]/Re[V_s]) - \arctan(Im[V_r]/Re[V_r]) \quad \text{(Equation 8)}$$

The phase shift offset angle, $\Delta\theta$, is an indication of the phase shift offset. As used herein, the phase shift offset can be an angular measure in degrees or radians, or can be a fraction of a cycle that is indicative of an amount of phase offset between data sent through the transmission line from the sending side near the reference monitoring device 128 and received at the second monitoring device 130. Other apparatuses (e.g., transformers, current transformers, power transformers, and similar devices) that result in some amount of phase shift offset can also be considered, and can be accounted for by estimating the phase shift offset due to the other apparatuses in addition to the phase shift offset due to the transmission line.

Additionally, other aspects of the performance of the transmission line can be estimated based on the model parameters used to calculate phase shift offsets. In particular, for a model transmission line based on an equivalent pi model where the sent voltage and the received voltage can both be measured at a time when loads connected to the power monitoring system are not changing in time, such as during a measurement time with a duration of one cycle, it is possible to calculate the model parameters for the transmission line from the measurements of the sent and received sides. Calculation of the model parameters from measured sent and received voltages and currents can be advantageous in order to estimate various performance aspects of the transmission line and power delivery system. Calculation of the model parameters based on the measured sent and received voltages and currents can be carried out when the relative phase offset between the sent and received voltages ($V_s$ and $V_r$) are known and, the relative phase offset between the sent and received currents ($I_s$ and $I_r$) are known. The relative phase offsets can be determined, for example, using a system incorporating GPS units to precisely timestamp data measured at multiple monitoring devices.

In a configuration, the steady-state inductive and capacitive reactances for the transmission line are determined from the line frequency, conductor length, conductor type, geometric configuration, and so forth as described above, and the phase shift offset is determined according to the methods provided in FIGS. 7 through 10.

Figure 7:
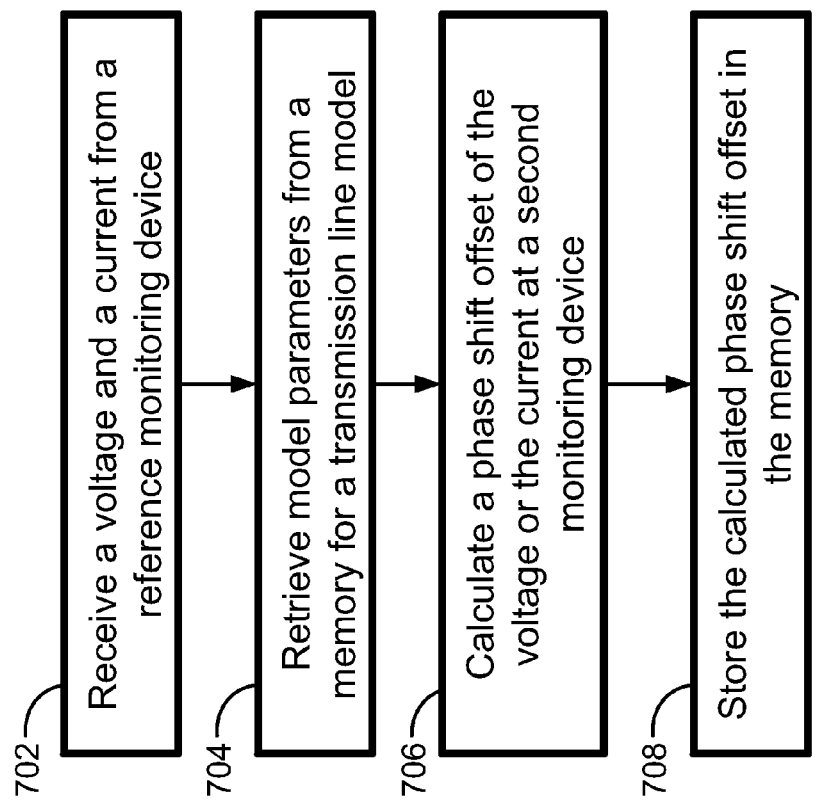
FIG. 7 is a flowchart illustrating a method for automatically aligning a measured power-related data in a power monitoring system to a common reference point using phase shift offsets.

FIG. 7 is a flowchart illustrating an exemplary method for automatically aligning a measured power-related data in a power monitoring system 120 to a common reference point using phase shift offsets. The method shown in FIG. 7 can optionally be implemented following an implementation of the algorithm for determining a cycle count offset between monitoring devices in a power monitoring system 120 described above in connection with FIG. 4. By implementing the cycle count offset algorithm prior to the phase shift offset algorithm, the data measured during an implementation of the method shown in FIG. 7 is advantageously aligned within a cycle, which is close enough to negate effects of load changes in the power monitoring system 120.

Referring again to FIG. 7, the method illustrated may be generally described with reference to the reference monitoring device 128 for the sake of clarity, but implementations of the present disclosure generally encompass methods where actions described in connection with the reference monitoring device 128 are undertaken by all monitoring devices (128, 130) in the power monitoring system 120. In operation of the method illustrated in FIG. 7, the system controller 132 receives a measured voltage and a measured current from the reference monitoring device 128 (702). The system controller 132 can receive the measured voltage and the measured current (702) over the communications network composed of the couplings between the communication interface 140 of the reference monitoring device 128 and the system controller 120. The system controller 132 retrieves model parameters from the memory 133 (704) for a transmission line model that characterizes a circuit including a conductor 123a connected between the reference monitoring device 128 and the second monitoring device 130. The model parameters are similar to those described above in connection with the example equivalent pi transmission line model shown in FIG. 6. The model parameters retrieved from the memory 133 can include the series resistance, the series impedance, the shunt admittance, or a subset of these. Alternatively, the system controller 132 can retrieve parameters indicative of the model parameters of the line transmission model. For example, the memory 133 can store the inductive reactance, $X_L$, rather than the series inductance.

Referring again to FIG. 7, the phase shift offset of signals transmitted on the conductor 123a between the reference monitoring device 128 and the second monitoring device 130 is calculated (706). The calculation of the phase shift offset is carried out according to a function including the retrieved model parameters and the measured voltage and current. The phase shift offset indicates a phase difference of the current of voltage between the reference monitoring device 128 and the second monitoring device 130. The phase shift offset can be indicated, for example, as a number of degrees, radians, or a fractional portion of a cycle. Equations 6 and 8 can be used to calculate the phase shift offset from the measured current, measured voltage, and model parameters of the transmission line. The phase shift offset associated with the reference monitoring device 128 and the second monitoring device 130 is then stored in the memory 133 (708). The system controller 132 can be configured to operate according to software to perform the algorithm shown in FIG. 7. The software can be stored on a computer readable medium.

In an implementation, the method illustrated by FIG. 7 can be completed automatically by the system controller 132 sending command signals to the monitoring devices (128, 130) in the power monitoring system 120. Responsive to command signals sent to the monitoring devices (128, 130), each monitoring device (128, 130) sends data indicative of a measured voltage or current at each the monitoring device (128, 130), which data enables the system controller 132 to compute phase shift offsets for each pair of monitoring devices (128, 130) in the power monitoring system 120 after retrieving model parameters characterizing a transmission line model corresponding the transmission line between each pair of monitoring devices (128, 130).

In an alternative implementation of the present disclosure, the method illustrated by FIG. 7 can be altered such that phase shift offsets are calculated from waveform data sampled at the reference monitoring device 128 and the second monitoring device 130. The waveform data can be, for example, data similar to the data illustrated in FIG. 3. The waveform data can be communicated to the system controller 132 over the communications network, and the system controller 132 can analyze the waveform data from the monitoring devices (128, 130) to determine the phase shift offsets. The phase shift offsets can be computed according to conventional techniques understood by those skilled in the art of digital signal processing, and power systems analysis techniques. Analysis techniques can include a cross correlation analysis of the waveform data received at both the reference monitoring device 128 and the second monitoring device 130. The system controller 132 can be configured to operate according to software to automatically perform the algorithm shown in FIG. 7. The software can be stored on a computer readable medium.

The system controller 132 can synchronize the clocks of the second monitoring device 130 and the reference monitoring device 128 at the point of alignment. The system controller 132 reads the cycle count in each monitoring device and the associated monitoring device's on-board clock time or another time reference of the monitoring device, including a cycle count of the monitoring device. The time reference of each monitoring device (128, 130) in the power monitoring system 120 can be adjusted, or tuned, based on a calculated phase shift offset for each pair of monitoring devices and based on a determined cycle count offset for each monitoring device. A monitoring device's on-board clock time and cycle count may drift with respect to each other due to the limitations of the on-board clock. Due to the clock drift, it may be necessary to re-read the time associated with a device's cycle count periodically to reestablish the device's time reference. The software on the system controller 132 will then update the matrix containing the monitoring device time reference information.

Figure 8:
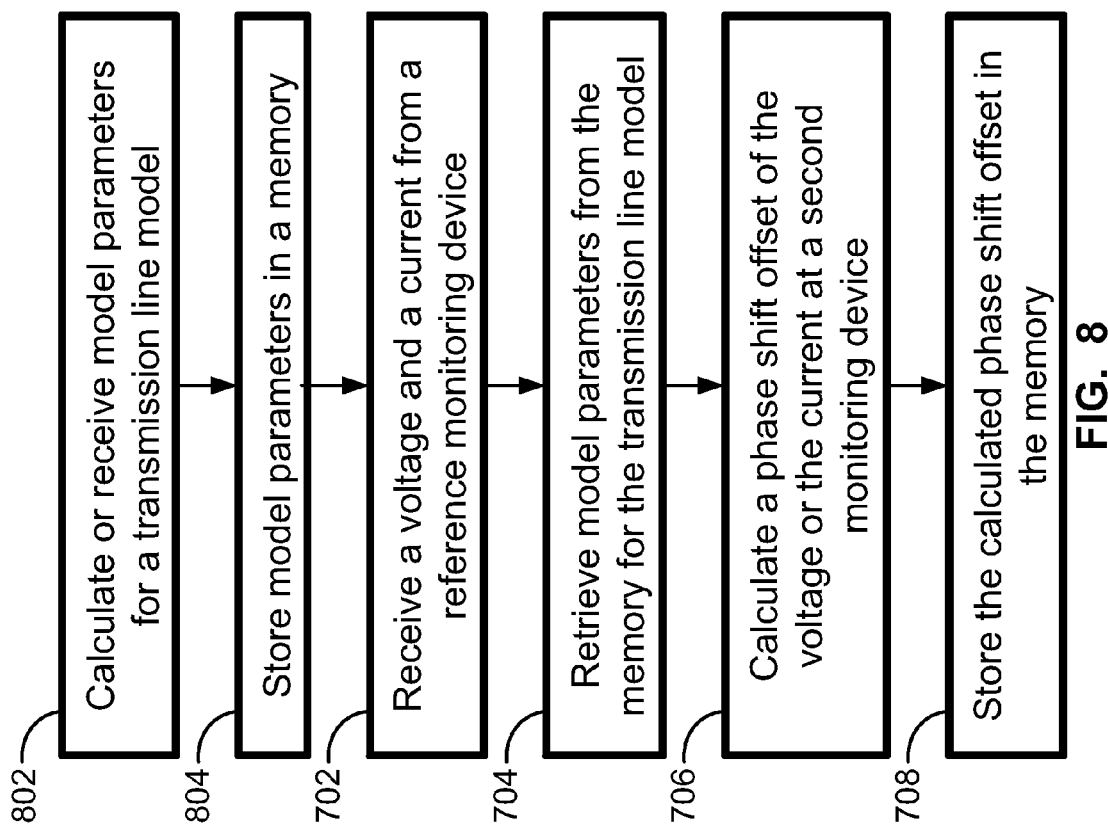
FIG. 8 is a flowchart illustrating a method for automatically aligning a measured power-related data in a power monitoring system to a common reference point after calculating or receiving model parameters for the transmission line model.

FIG. 8 is a flowchart illustrating a method for automatically aligning a measured power-related data in a power monitoring system 120 to a common reference point after calculating or receiving model parameters for the transmission line model. The calculation of the model parameters (802) can be carried out similarly to the discussion included above in connection with FIG. 6. Generally, the model parameters are calculated according to a function of the design criteria of the transmission line. The design criteria influencing the model parameters can include: the length of the conductor 123a, the cross-section area of the conductor 123a, the resistivity of the conductor 123a, the material of the conductor 123a, whether the conductor 123a is solid or stranded, the number of conductors per phase, the spacing distance between the conductor 123a and another conductor 123b carrying current between the reference monitoring device 128 and the second monitoring device 130, the geometry of the conductors (123a, 123b, 123c), the transposition of conductors, multi-circuit conductor lines, the fundamental frequency of the current or voltage, and the voltage. While the design criteria listed above refer to aspects of the first conductor 123a, and to relationships between the first conductor 123a and 123b, implementations of the present disclosure can incorporate similar design criteria for each conductor (123a, 123b, 123c) and for relationships between each pair of conductors (e.g., 123b, 123c) in the power monitoring system 120. Generally, the model parameters can optionally be advantageously calculated by accounting for design criteria of all conductors in a power monitoring system and not just a subset. As previously described, implementations of the present disclosure can utilize software programs to compute the model parameters based on the design criteria or based on other parameters. The model parameters can also be received (802) by the system controller 132 from an input indicative of the series resistance, the series inductance, and the shunt admittance. Following the calculation or receipt of the model parameters (802), the model parameters are stored in the memory 133 (804) for future use.

FIG. 9 is a flowchart illustrating a method of calculating the phase shift offset between two monitoring devices and adding the phase shift offset to an associated cycle count offset for the monitoring devices. The method of calculating the phase shift offset between two monitoring devices illustrated in FIG. 9 can be a method of carrying out the calculating a phase shift offset (706) in the method illustrated in the flowchart of FIG. 7. In describing the calculation of the phase shift offset, reference is made to both FIGS. 1 and 6 to describe the calculation of the phase shift using an equivalent pi model of a transmission line that characterizes a circuit including a conductor 123a between the reference monitoring device 128 and the second monitoring device 130. Referring again to FIG. 9, the phase shift offset is calculated by calculating the shunt admittance (506, 508), Y, between the reference monitoring device 128 and the second monitoring device 130 (902). The admittance is calculated based on retrieved model parameters according to Equations 2 and 4. Next, the current flowing across the lumped impedance, $I_{ab}$, characterized by $Z_L$, is calculated (904). The current flowing across the lumped impedance is a function of the measured current, $I_r$, the measured voltage, $V_r$, and the calculated admittance, Y, as is provided in Equation 9. The current flowing across the lumped impedance can be referred to as $I_{ab}$ with "a" and "b" referring the reference nodes labeled in FIG. 6, and $I_{ab}$ is the current flowing from node a to node b.

$$I_{ab} = I_r + jV_r Y/2 \qquad \text{(Equation 9)}$$

In Equation 9, j equals the square root of negative one. Generally, $I_r$ and $V_r$ can be complex numbers having a real and an imaginary component, although one or the other may be chosen as a reference such that it has no imaginary component. If there is some phase offset between $I_r$ and $V_r$, then at least one of them generally has an imaginary component. Next the voltage at the second monitoring device 130 is calculated (906) using Equation 10, which is equivalent to Equation 6.

$$V_s = V_r + I_{ab} Z_L \quad \text{(Equation 10)}$$

In Equation 10, $Z_L$ is given by Equation 5, $I_{ab}$ is given by Equation 9, and $V_r$ is measured. The phase shift offset angle, $\Delta\theta$, can then be calculated using Equation 8. In an implementation the calculating Y (902), $I_{ab}$ (904), and $V_s$ (906) using the model parameters of transmission line model and the measured current and voltage can constitute a method of carrying out the calculating a phase shift offset (704) in FIG. 7.

Referring again to FIG. 9, following the calculation of the phase shift offset, which can be indicated by the phase shift offset angle, the system controller 132 can add the phase shift offset to an associated cycle count offset to form an aggregate offset (908). The adding to produce an aggregate offset (908) can be carried out for a pair of monitoring devices (128, 130) in the power monitoring system 120 so long as the pair has an associated cycle count offset. The associated cycle count offset can be generated according to the method illustrated by the flowchart in FIG. 10, or by the similar methods discussed in connection with the flowchart in FIG. 4. The aggregate offset is stored in the memory 133 (910) and entered in a matrix (912). In an implementation, adding the phase shift offset to produce the aggregate offset (908) can be carried out when the cycle count offset is an integer number of cycle counts and the phase shift offset is a fractional number of cycle counts less than one. In an implementation where the cycle count offset is a number of degrees of the phase shift offset angle, the aggregate offset can be produced by adding the cycle count offset to the phase shift offset angle divided by 360 degrees. The aggregate offset is a real number not limited to an integer number that represents a number of cycles of alignment offset between data recorded on a reference monitoring device 128 and data recorded on a second monitoring device 130. According to an aspect of the present disclosure, the phase shift offset provides fine tuning to an associated cycle count offset by incrementing or decrementing the aggregate offset by amounts less than one cycle. The aggregate offset generally provides a more accurate determination of the temporal alignment between the two monitoring devices (128, 130).

The phase shift offsets for each pair of monitoring devices (e.g., 128, 130) in the power monitoring system 120 are managed in a phase shift offset matrix, $P_{ij}$. The phase shift offset between a monitoring device pair $(M_i, M_j)$ can be determined by subtracting or adding the phase angle of the voltage at monitoring device number j, $P_j$, from the phase angle of the voltage at monitoring device number i, $P_i$. The elements of the phase shift offset matrix, $P_{ij}$, is then calculated according to Equation 11. While $P_{ij}$ refers to an element of the phase shift offset matrix, the matrix as a whole can be referred to as P.

$$P_{ij} = P_i - P_j \quad \text{(Equation 11)}$$

For example, if the reference monitoring device 128 has a phase shift offset angle, $P_1 = 6°$ with respect to a reference phase angle, and the second monitoring device 130 has a phase shift offset angle, $P_2 = 18°$, then the phase angle offset between the two monitoring devices, $P_{12} = -12°$. Similarly, $P_{21} = +12°$. When i=j, the phase angle offset is always zero because the Equation 11 is calculating the phase shift offset of a monitoring device with itself. Table 1 provides an example of the phase shift offset matrix, P, having n rows and n columns for a power monitoring system with n monitoring devices. Each row and column of P includes every capable monitoring device in the power monitoring system 120.

TABLE 1

Phase Shift Offset Matrix

|       | $P_1$    | $P_2$    | $P_3$    | $P_4$    | ... | $P_j$    |
|-------|----------|----------|----------|----------|-----|----------|
| $P_1$ | 0        | $P_{12}$ | $P_{13}$ | $P_{14}$ | ... | $P_{1n}$ |
| $P_2$ | $P_{21}$ | 0        | $P_{23}$ | $P_{24}$ | ... | $P_{2n}$ |
| $P_3$ | $P_{31}$ | $P_{32}$ | 0        | $P_{34}$ | ... | $P_{3n}$ |
| $P_4$ | $P_{41}$ | $P_{42}$ | $P_{43}$ | 0        | ... | $P_{4n}$ |
| .     | .        | .        | .        | .        | 0   | .        |
| .     | .        | .        | .        | .        |     | .        |
| .     | .        | .        | .        | .        |     | .        |
| $P_n$ | $P_{n1}$ | $P_{n2}$ | $P_{n3}$ | $P_{n4}$ | ... | 0        |

The phase shift offset matrix, P, is a skew symmetric (anti-symmetric) matrix because $P_{ij} = P_j - P_i = -P_{ji}$, and the diagonal components of P are zero, that is $P_{ii} = 0$. Furthermore, because $P_{ij}$ is skew symmetric, the transpose of P, $P^T$ is equal to negative P (i.e., $P^T = -P$).

Because the phase offsets for all monitoring devices in the power monitoring system 120 move together as the reference signal moves, the phase shift offsets between any monitoring device pair is constant, during steady-state conditions. The phase shift offsets may fluctuate slightly as the load conditions change, but this can be factored in from periodic readings and analysis of the measured current and measured voltage (e.g., $V_r$ and $I_r$) with respect to the transmission line model according to the above described methods in connection with FIGS. 7 and 8.

FIG. 10 is a flowchart illustrating a method of associating a cycle count offset between two monitoring devices. Reference signal data is received in the system controller 132 from the reference monitoring device 128 (1002). Second signal data is received in the system controller 132 from the second monitoring device 130 (1004). The reference signal data and the second signal data can be data representing frequency variations in the measured current or voltage at each cycle of a predetermined number of cycle counts of the measured current or voltage. The system controller 132 analyzes the reference signal data and the second signal data to determine a cycle count offset between the monitoring devices (128, 130) and associates the offset between the devices (1006). The system controller 132 associates the cycle count offset (1006) using the frequency variations in the received reference signal data and second signal data to determine the cycle count offset needed to align the frequency variations in the reference signal data with the frequency variations in the second signal data. The system controller 132 can associate the cycle count offset between the two devices (1006) by, for example, using the cross-correlation techniques discussed above in connection with the flowchart illustrated in FIG. 4. The system controller 132 then stores the cycle count offset in the memory 133 (1008).

Furthermore, the cycle count offsets can be entered in a cycle count offset matrix, M. The cycle count offset matrix is both fixed and unique for a given power monitoring system 120, provided no monitoring device resets. If a monitoring device or devices are reset while the algorithm is operating, the algorithm can note the reset and either create an entirely new cycle count offset matrix or realign only those monitoring devices that lost alignment by amending the entries of the cycle count offset matrix corresponding to the monitoring devices that lost alignment. Similarly, responsive to a monitoring device being reset, an entirely new phase shift offset matrix can be created, or the phase shift offset matrix can be amended to replace entries corresponding to monitoring devices that lost alignment.

An alternative implementation of present disclosure measures the sending and receiving voltage data ($V_s$ and $V_r$) and the sending and receiving current data ($I_s$ and $I_r$) concurrently. During measurement, the alignment algorithm logs the predetermined number of consecutive cycle-by-cycle frequency data from each metering device, such as the reference monitoring device 128 and the second monitoring device 130 ($M_1$ and $M_2$ in FIG. 6). The voltages and current can be sampled more than once during the frequency logging period to account for system operation changes. For example, one method is to sample $V_s$ and $V_r$, and $I_s$ and $I_r$ at the beginning and end of the frequency logging period for each respective monitoring device (128, 130), and using the average calculated voltage and current values for the phase shift calculations. Furthermore, additional voltage and current measurements can be taken from each monitoring device (128, 130) during the frequency logging period and weighted accordingly to determine a value to be used for calculating the phase shift. At this point the frequency data from both monitoring devices (128, 130) have not been aligned, so the sending and receiving voltages and currents from each device are not synchronous with each other. However, during steady-state conditions they will be adequate for alignment purposes.

Figure 11:
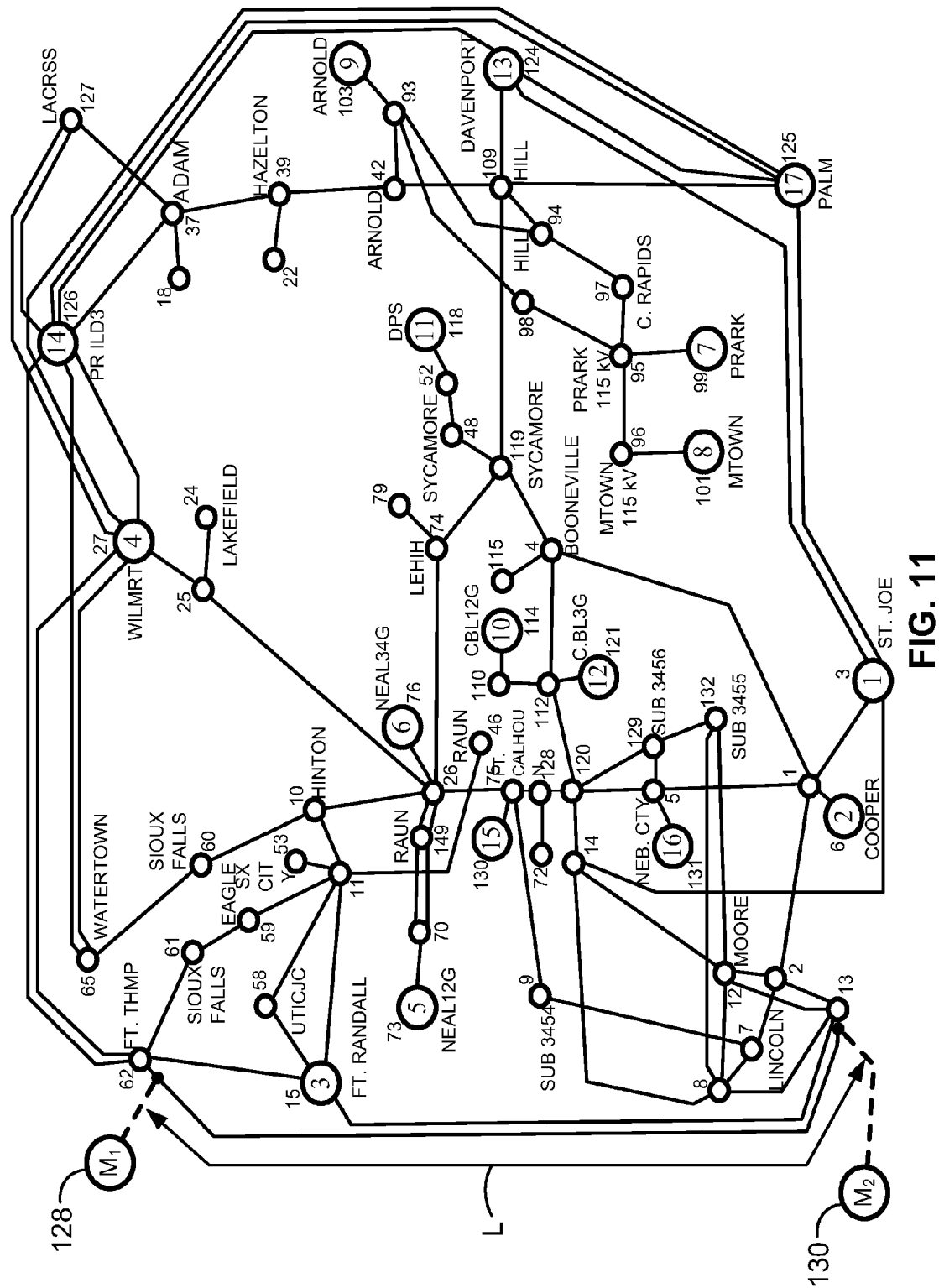
FIG. 11 is an example of a large power monitoring system including a reference monitoring device and a second monitoring device between two nodes separated by a distance L.

FIG. 11 is an example of a large power monitoring system including a reference monitoring device 128 and a second monitoring device 130 between two nodes separated by a distance L. The power monitoring system in FIG. 11 includes several generators (large numbered circles) and substations (smaller numbered circles). The phase shift between Node 62 and Node 13 is calculated below based on a measured current and measured voltage at Node 13, and model parameters characterizing the transmission line between Nodes 62 and 13. The transmission line model is the equivalent pi model shown in FIG. 6. In the configuration shown in FIG. 11, energy is flowing from Node 62 (sending side) to Node 13 (receiving side).

For the purposes of the example calculation below the model is a three-phase, 60 Hertz system with the phases arranged in a wye configuration. The model parameters for the transmission line model are as follows: the conductor has a length of 100 miles, the resistance of the conductor is 0.129Ω/(mile·conductor), the inductive reactance is 0.75Ω/(mile·conductor), and the capacitive reactance is 0.177×10$^6$ (Ω·mile)/conductor. The power received at Node 13 is 191.2 MW, with a power factor of 80% lagging the voltage, and the line voltage received at Node 13 is 230 kV. The power factor can be expressed as an angle, θ, with the magnitude of the power factor given by cos(θ). The angle, θ, is a phase angle by which the received current, $I_r$, trails the received voltage, $V_r$, and can be used to find the real and reactive components of $I_r$ with respect to $V_r$.

Using the parameters listed above, the values of the series resistance, R, the inductive reactance, $X_L$, the capacitive reactance, $X_C$, and the admittance, Y, of the transmission line model characterizing the transmission line between Node 62 and Node 13 are as follows:

$R = 0.129Ω/(\text{mile·conductor}) \times 100 \text{ miles} = 12.9\ Ω$, $X_L = 0.75Ω/(\text{mile·conductor}) \times 100 \text{ miles} = 75\ Ω$, $X_C = 0.177 \times 10^6 (Ω\text{·mile})/\text{conductor}/(100 \text{ miles}) = 1770\ Ω$, $Y/2 = 1/(2X_C) = 1/(2 \times 1770Ω) = 2.824 \times 10^{-4}$ S, $Z_L = (12.9 + j75)Ω$ (lumped series impedance), and $θ = \arccos(0.8) = -36.9°$, where θ is negative because the power factor is lagging. The line current received at Node 13, the magnitude of $I_r$, can be derived from the received power, $P_{ow}$, the received line voltage $V_l$, and the power factor.

$P_{ow} = \sqrt{3} V I_r \cos(θ)$, so $I_r = P_{ow}/(\sqrt{3} V pp \cos(θ)) = 191.2 \times 10^6\ W/(\sqrt{3} \times 230 \times 10^3\ V \times 0.8) = 600$ A If the received line voltage, $V_r$, is taken as reference, with a zero phase angle, then $V_r = V_l/\sqrt{3} = 230 \times 10^3\ V/\sqrt{3} = 132.8$ kV, and $I_r = 600$ A$\times(\cos(θ) + j\sin(θ)) = 600$ A$\times(0.8 - j0.6) = (480 - j360)$ A The current flowing through the lumped series impedance characterized by $Z_L$ is computed according to Equation 9 and the line-to-neutral voltage at Node 62, $V_s$, is computed according to Equation 10:

$I_{ab} = I_r + jV_r Y/2 = (480 - j360)A + j(132.8 \times 10^3\ V)(2.824 \times 10^{-4})$ S $I_{ab} = (480 - j322.5)$ A $V_s = V_r + I_{ab} Z_L = 132.8 \times 10^3 V + (480 - j322.5)$ A$(12.9 + j75)Ω$ $V_s = (163.2 + j31.8)$ kV = 166.8 kV, with a phase angle of 11°.

Therefore, the phase shift offset between $V_r$ and $V_s$ is an angle of 11°, which corresponds to a fractional cycle count offset of 11/360 or 0.03 cycles. In the example provided, the phase shift offset is positive because $V_s$ leads $V_r$ by 11°. In other words, the phase seen by the monitoring device on the sending side is causing a cycle shift of about 3% compared to the monitoring device on the receiving side (in addition to any integer cycle count offsets as determined from the frequency variations). These calculations can be performed for all pairs of monitoring devices across the power monitoring system to determine the phase shift offsets for all monitored points with respect to each other. In an implementation, additional characteristics can optionally be incorporated into the calculations as required to account for apparatuses that introduce phase shifts, such as phase shifts due to: transformer configurations, potential and current transformers, multiple paths, conductor configurations, line lengths, and so forth. The example above determines the phase shift offset of the sending side voltage $V_s$ from the model parameters, measured power from the receiving side, measured voltage from the receiving side, and measured power factor. However, these calculations can also be performed using measurements from the sending side to determine the phase shift of the receiving side voltage. The calculations can be performed using the receiving side current instead of the power. Furthermore, the calculation of the phase shift offset can be carried out by calculating the sending side current according to Equation 7, and comparing with the receiving side current. In the calculations above, $V_r$ was chosen as the reference voltage; however, the preference could have been to choose $V_s$ as the reference voltage with $V_r$ having a phase shift offset of −11°.

Loads and power factors vary, so there will be some variation in the determined phase shift offsets. Because the transmission line models, and models for apparatuses such as transformers, potential transformer, and the like, are static, periodically reacquiring voltage and current readings from the monitoring devices is adequate to adjust the phase shift offsets in most circumstances. Aspects of the present disclosure further provide for creating a lookup table for each monitoring device pair based on real and reactive power flows between each monitoring device pair. The lookup table can be configured as a matrix with a number of rows and a number of columns equal to the number of monitoring devices in the power monitoring system. The lookup table can include phase shift offsets for each monitoring device pair for a given real and reactive load. Aspects of the present disclosure are especially suitable for radial-fed power monitoring systems that have only one path for currents to flow, but are not limited to such systems. The phase shift offsets coupled with the cycle count offsets can produce a very precise understanding of how measured data that was captured by a pair of monitoring devices differs with respect to time from one another. These accurate offsets can be used in, for example, sequence of events analysis (e.g., how and when a fault propagates through the electrical system), fault detection analysis or other analyses, clock adjustment in the monitoring devices (e.g., converting the cycle and phase shift offsets into a corresponding time value based on the system frequency), and determining power flows through the electrical system being monitored.

While particular embodiments and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of the invention as defined in the appended claims.

What is claimed is:

1. A method for automatically aligning measured power-related data in a power monitoring system to a common reference point, comprising:
  receiving over a communications network from a reference monitoring device in the power monitoring system a voltage and a current measured by the reference monitoring device;
  retrieving from a memory model parameters of a transmission line model that characterizes a circuit including a conductor connected between the reference monitoring device and a second monitoring device in the power monitoring system;
  calculating a phase shift offset according to a function that includes the measured voltage, the measured current, and the model parameters, the phase shift offset indicating a phase difference of the current or voltage between the reference monitoring device and the second monitoring device;
  storing the phase shift offset associated with the reference monitoring device and the second monitoring device;
  adding the phase shift offset to a determined cycle count offset associated with the reference monitoring device and the second monitoring device to produce an aggregate offset, the cycle count offset representing an integer number of cycles that a measured characteristic by the reference monitoring device is to be added to or subtracted from a cycle count of the measured characteristic by the second monitoring device at a measured time, the cycle count representing a number of consecutive cycles of the measured voltage or current counted by the reference monitoring device or the second monitoring device;
  aligning the first voltage or current measured by the reference device temporally with the voltage or current measured by the second monitoring device using the aggregate offset; and
  adjusting at least one parameter of the second monitoring device based at least in part on the phase shift.

2. The method of claim 1, wherein the model parameters include a series resistance and a series inductance.

3. The method of claim 2, wherein the model parameters further include a shunt admittance.

4. The method of claim 3, wherein the model parameters further include a shunt conductance as part of the shunt admittance.

5. The method of claim 1, further comprising:
  calculating the series resistance, the series inductance, or the shunt admittance using modeling data associated with the transmission line model, the modeling data including a frequency of the voltage or the current measured by the reference monitoring device, a length of the conductor between the reference monitoring device and the second monitoring device, a spacing distance between the conductor and an other conductor carrying current between the reference monitoring device and the second monitoring device, a cross-sectional area of the conductor, or a material of the conductor; and
  storing the calculated series resistance, the series inductance, or the shunt admittance in the memory.

6. The method of claim 1, further comprising: receiving an input indicative of the series resistance, the series inductance, or the shunt admittance; and
  storing the inputted series resistance, series inductance, or shunt admittance in the memory.

7. The method of claim 1, wherein the voltage measured by the reference monitoring device is a potential between the conductor and an other conductor carrying current between the reference monitoring device and the second monitoring device, wherein the potential is measured at the reference monitoring device.

8. The method of claim 7, wherein the other conductor is a neutral conductor, and wherein the conductor is a line conductor.

9. The method of claim 6, wherein the conductor is a line conductor carrying a first phase of the current, and the other conductor is a second line conductor carrying a second phase of the current.

10. The method of claim 3, wherein the calculating the phase shift offset includes:
  calculating the shunt admittance;
  calculating a current flowing across a lumped series impedance of the transmission line model as a function of the measured current, the measured voltage, and the calculated admittance, the lumped series impedance representing both the series resistance and a reactance of the series inductance; and
  calculating a voltage at the second monitoring device as a function of the measured voltage and the current flowing across the lumped series impedance.

11. The method of claim 1, wherein each of the cycles represents a period between consecutive positive zero-crossings of the measured voltage or current or between consecutive negative zero-crossings of the measured voltage or current, or wherein each of the cycles represents a period between consecutive positive and negative zero-crossings of the measured voltage or current.

12. The method of claim 1, wherein the power monitoring system includes an apparatus that introduces a phase shift in the current or voltage measured by electrical circuits downstream of the apparatus relative to electrical circuits upstream of the apparatus.

13. The method of claim 1, wherein responsive to the storing the phase shift offset, the measured current or the measured voltage of the reference monitoring device are synchronized to the same common reference point with the current or voltage measured by the second monitoring device.

14. The method of claim 1, further comprising:
receiving reference signal data from the reference monitoring device, the reference signal data representing frequency variations in the measured current or voltage at each cycle of a predetermined number of cycle counts of the measured current or voltage by the reference monitoring device;
receiving second signal data from the second monitoring device, the second signal data representing frequency variations in the measured current or voltage at each cycle of a predetermined number of cycle counts of the measured current or voltage by the second monitoring devices;
associating a reference one of the cycle counts of the measured current or voltage by the reference monitoring device with a corresponding one of the cycle counts of the measured current or voltage by the second monitoring device using the frequency variations in the measured current or voltage by the reference monitoring device and the frequency variations in the measured current or voltage by the second monitoring device to produce the determined cycle count offset; and
storing the cycle count offset.

15. The method of claim 1, wherein the receiving, the retrieving, the calculating, and the storing are carried out using a controller remote from the reference monitoring device and the second monitoring device.

16. The method of claim 1, further comprising instructing the reference monitoring device or the second monitoring device to adjust a time reference of the reference monitoring device or the second monitoring device based on at least the phase shift offset to cause the voltage or current measured by the reference monitoring device and the second monitoring device to be synchronized to the common reference point.

17. The method of claim 1, wherein the power monitoring system includes a plurality of monitoring devices including the reference and second monitoring devices, the method further comprising:
calculating a phase shift offset associated with each of the monitoring devices relative to every other of the monitoring devices and storing the corresponding phase shift offset in a phase shift offset matrix having a number of rows corresponding to the number of monitoring devices in the power monitoring system and a number of columns corresponding to the number of monitoring devices in the power monitoring system.

18. The method of claim 1, further comprising:
measuring a real and reactive power flow between the reference monitoring device and the second monitoring device; and
storing the calculated phase shift offset and an indication of the real and reactive power flow in a matrix for calculating a phase shift offset for a given real and reactive load.

19. A computer readable medium encoded with instructions for directing a controller to perform the method of claim 1.

20. A power monitoring system for aligning data, comprising:
a system controller coupled to a memory;
a reference monitoring device having a communication interface, a controller, and a sensing circuit, the communication interface being coupled to the system controller; and
a second monitoring device having a communication interface coupled to the system controller, a controller, and a sensing circuit, the communication interface coupled to the system controller, and wherein the system controller is remote from the reference monitoring device and the second monitoring device;
wherein the system controller is configured to:
receive from the reference monitoring device a voltage and a current measured by the reference monitoring device;
retrieve from the memory model parameters of a transmission line model that characterizes a circuit including a conductor connected between the reference monitoring device and the second monitoring device;
calculate a phase shift offset according to a function that includes the measured voltage, the measured current, and the model parameters, the phase shift offset indicating a phase difference of the current or voltage between the reference monitoring device and the second monitoring device;
store the phase shift offset associated with the reference monitoring device and the second monitoring device;
add the phase shift offset to a determined cycle count offset associated with the reference monitoring device and the second monitoring device to produce an aggregate offset, the cycle count offset representing an integer number of cycles that a measured characteristic by the reference monitoring device is to be added to or subtracted from a cycle count of the measured characteristic by the second monitoring device at a measured time, the cycle count representing a number of consecutive cycles of the measured voltage or current counted by the reference monitoring device or the second monitoring device;
align the first voltage or current measured by the reference device temporally with the voltage or current measured by the second monitoring device using the phase shift aggregate offset; and
adjust at least one parameter of the second monitoring device based at least in part on the phase shift.

21. The power monitoring system of claim 20, wherein the reference monitoring device and the second monitoring device are power meters.

22. The power monitoring system of claim 20, wherein the model parameters include a series resistance and a series inductance.

23. The power monitoring system of claim 22, wherein the model parameters further include a shunt admittance.

24. The power monitoring system of claim 20, wherein the system controller is further configured to calculate the phase shift offset by:
calculating a shunt admittance;
calculating a current flowing across a lumped series impedance of the transmission line model as a function of the measured current, the measured voltage, and the calculated admittance, the lumped series impedance representing the sum of the series resistance and a reactance of the series inductance; and calculating a voltage at the second monitoring device as a function of the measured voltage and the current flowing across the lumped series impedance.

25. The system of claim 20, wherein the system controller is further configured to:

receive reference signal data from the reference monitoring device, the reference signal data representing frequency variations in the measured current or voltage at each cycle of a predetermined number of cycle counts of the measured current or voltage by the reference monitoring device;

receive second signal data from the second monitoring device, the second signal data representing frequency variations in the measured current or voltage at each cycle of a predetermined number of cycle counts of the measured current or voltage by the second monitoring devices;

associate a reference one of the cycle counts of the measured current or voltage by the reference monitoring device with a corresponding one of the cycle counts of the measured current or voltage by the second monitoring device using the frequency variations in the measured current or voltage by the reference monitoring device and the frequency variations in the measured current or voltage by the second monitoring device to produce the determined cycle count offset between the reference cycle count and the corresponding cycle count; and store the cycle count offset in the memory.

\* \* \* \* \*